United States Patent [19]
Dammeyer

[11] Patent Number: 4,982,189
[45] Date of Patent: Jan. 1, 1991

[54] ENCODER WITH WIDE INDEX

[75] Inventor: Ned E. Dammeyer, New Bremen, Ohio

[73] Assignee: Crown Equipment Corp., New Bremen, Ohio

[21] Appl. No.: 446,221

[22] Filed: Dec. 5, 1989

[51] Int. Cl.$^5$ .............................................. H03M 1/22
[52] U.S. Cl. ........................................... 341/6; 341/16
[58] Field of Search ..................... 341/3, 5, 6, 11, 13, 341/15, 16; 250/231

[56] References Cited

U.S. PATENT DOCUMENTS

| | | | |
|---|---|---|---|
| 3,500,449 | 3/1970 | Lenz | 341/6 |
| 4,212,000 | 7/1980 | Yamada | 341/16 |
| 4,233,592 | 11/1980 | Leichle | 341/6 |
| 4,524,347 | 6/1985 | Rogers | 341/3 |
| 4,599,605 | 7/1986 | Froeb et al. | 341/16 |
| 4,603,238 | 7/1986 | Griswold et al. | 341/6 |
| 4,719,449 | 1/1988 | Cousseau | 341/13 |
| 4,780,703 | 10/1988 | Ishida et al. | 341/6 |

OTHER PUBLICATIONS

Fred W. Kear, "How to Select Shaft-Position Encoders", Aug. 31, 1962, pp. 48–51, Electronics.

*Primary Examiner*—William M. Shoop, Jr.
*Assistant Examiner*—H. Kim
*Attorney, Agent, or Firm*—Biebel, French & Nauman

[57] ABSTRACT

An improved encoder for indicating angular position or rotation of a shaft, and particularly a digital encoder for use with materials handling vehicles, includes an index mark in an index band of the encoder that is made wider than the marks in the data tracks. Associated detecting circuitry is responsive to the wide index mark for creating a dead band around a neutral position of the encoder to permit the free movement of the encoder shaft by an angular amount determined by the width of the index band. The wide index band enlarges the tolerance permitted in the return of the shaft to its neutral position and when installing the encoder on a shaft. When an encoder having a wide index band is used with a control handle, such as in positioning devices and accelerators on materials handling vehicles, the control handle has an improved feel and response. The wide index also provides a safety factor in that slight movement of the shaft due to vibration or accidental touching of the control handle will not normally evoke a response since the rotational angle exceeds the index band before an output is generated. Circuit may also be provided to control the profile of the output signal in response to the amount of angular rotation of the encoder.

9 Claims, 7 Drawing Sheets

FIG-7
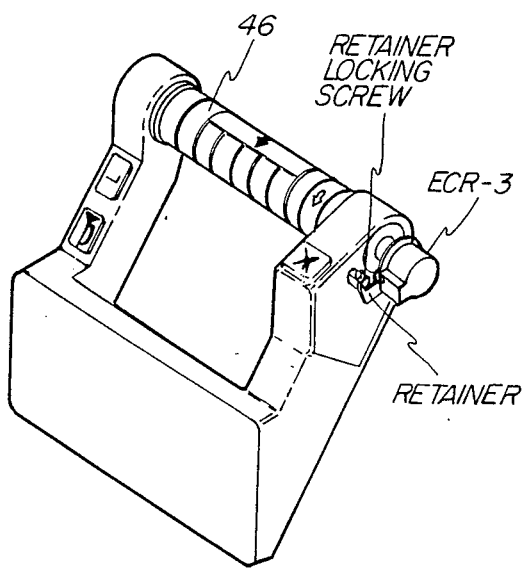
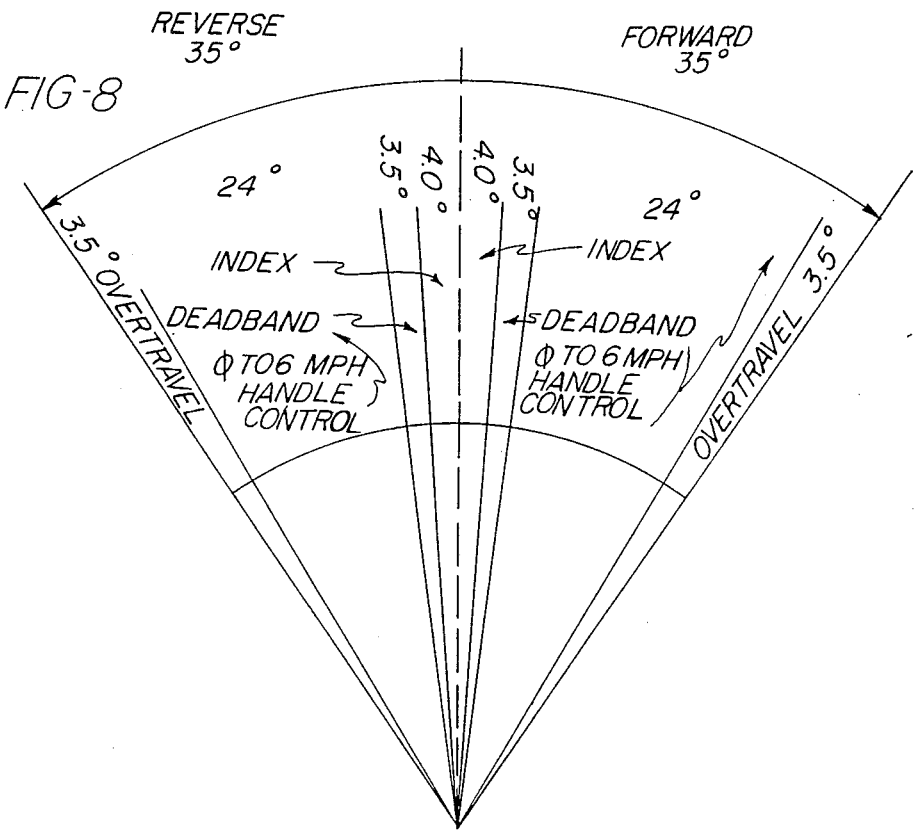
FIG-8

ENCODER WITH WIDE INDEX

BACKGROUND OF THE INVENTION

This invention relates to an improved encoder for indicating angular position or rotation of a shaft, and particularly a digital encoder for use with materials handling vehicles.

Material handling vehicles have used analog devices for indicating the position of various shaft positions, such as control devices. These analog devices, such as potentiometers, provide an absolute indication of position, however, these devices are subject to drift from age or heat and thus do not always provide the desired accuracy needed for some control functions. Conventional optical encoders for converting rotational motion of a shaft into digital signals typically include an encoder disc having rotation indicating track means provided with a plurality of spaced apart markings. These markings may take several forms, such as individual marks or pairs of equally spaced but offset, equally spaced apart marks on adjacent tracks. They are often optically detected by photoelectric means.

Digital encoders may include a pair of tracks where the coded marks alternate in order to provide an output signal indicating both the amount and the direction of rotation. In some encoders, an index track is provided with an index mark to provide a reference, as for example when the encoder is used in an application where it is necessary to determine a reference or neutral position of the shaft connected to the encoder.

SUMMARY OF THE INVENTION

The present invention relates to an improved encoder having a wide index band to provide improved feel and response when used in certain applications, such as in positioning devices and accelerators on materials handling vehicles.

The improved encoder is similar in most respects to prior art encoders except that the index band is made sufficiently wide and the associated detecting circuitry is designed to create a dead band around a neutral position of the encoder to permit the free movement of the encoder shaft by an angular amount determined by the width of the index band.

For example, when the improved encoder of this invention is used in connection with the accelerator control accelerator handle, the operator will notice that nothing will happen immediately, but as the rotational angle increases, the vehicle will begin to move, slowly at first but with increasing speed as the handle is rotated further and further.

Control devices often have springs for returning the device to its neutral position, but because of wear or misadjustment, the control device does not always return exactly to its neutral position. Further, installation of the encoder on a shaft cannot always be made with complete accuracy. The wide index band of this invention enlarges the tolerance permitted in the return of the shaft to its neutral position and when installing the encoder on a shaft. With a wide index, more than normal rotation of the shaft must be made before action of the rotation will be effected.

The wide index also provides a safety factor in that slight movement of the shaft due to vibration or accidental touching of the control handle will not evoke a response until the rotational angle exceeds the index band.

Circuit means are also be provided to control the profile of the output signal in response to the amount of angular rotation of the encoder. The shape of the profile curve will of course depend on the application.

It is therefore a object of this invention to provide an improved encoder that includes an index mark that is wide relative to the position indicating marks; and to provide an improved encoder that may be used in connection with speed and position controls to delay output signals until the encoder has been rotated a predetermined amount.

It is another object of this invention to provide a digital encoder for use with control devices on a materials handling vehicle with the encoder being provided with a wide index mark that permits a wide tolerance in the return of the control device to its neutral position, and also to provide a safety factor in requiring more than a slight movement of the control device from the neutral position before moving the encoder into its operating range.

It is a further object of this invention to provide an improved apparatus for converting rotational motion or a shaft into digital signals of the type that includes an encoder disc having rotation indicating track means provided with a plurality of spaced apart markings, an index track with at least one index marking contained thereon, means for sensing the presence of the markings on said rotation indicating track means for indicating the amount of angular rotation of said disc, and means for sensing the presence of the index mark, the improvement comprising the index marking on said index track being formed substantially wider than several individual rotation indicating markings, and means responsive to said wide index marking for indicating when said encoder disc has rotated more than the predetermined amount established by said index marking.

BRIEF DESCRIPTION OF THE DRAWINGS

FIG. 7 is a perspective view of the traction control twist grip;

FIG. 8 is a diagram representing the relationship between the traction control shaft position and the speed control functions;

DESCRIPTION OF THE PREFERRED EMBODIMENT

Figure 1:
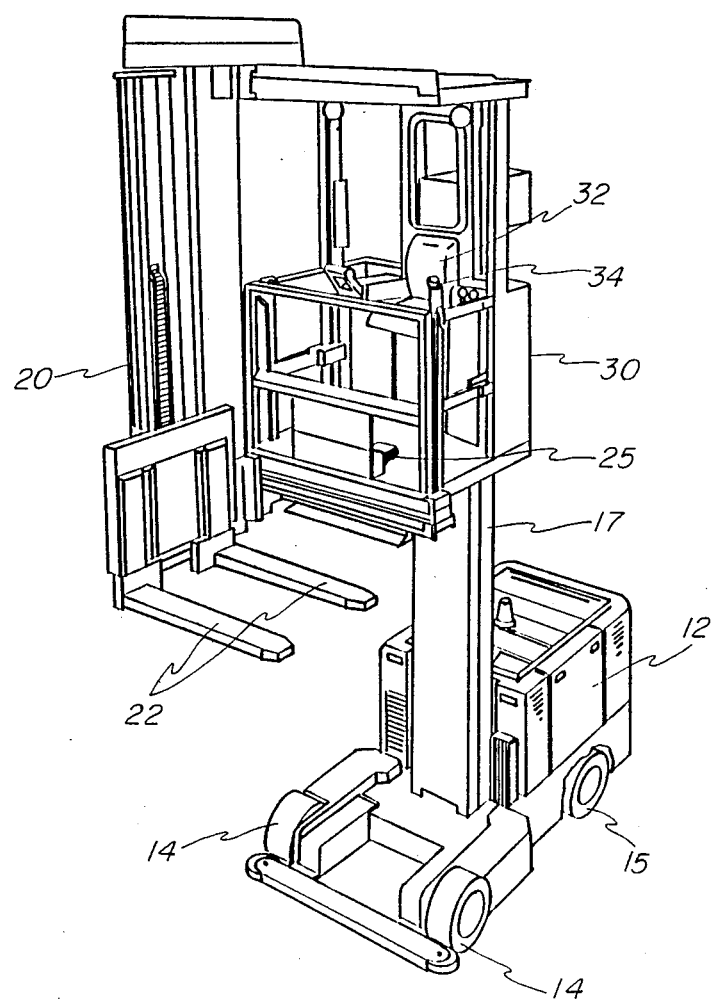
FIG. 1 is a perspective view of a materials handling vehicle, such as a turret stockpicker, that utilizes several encoders for indicating rotation of various control devices.
Figure 2:
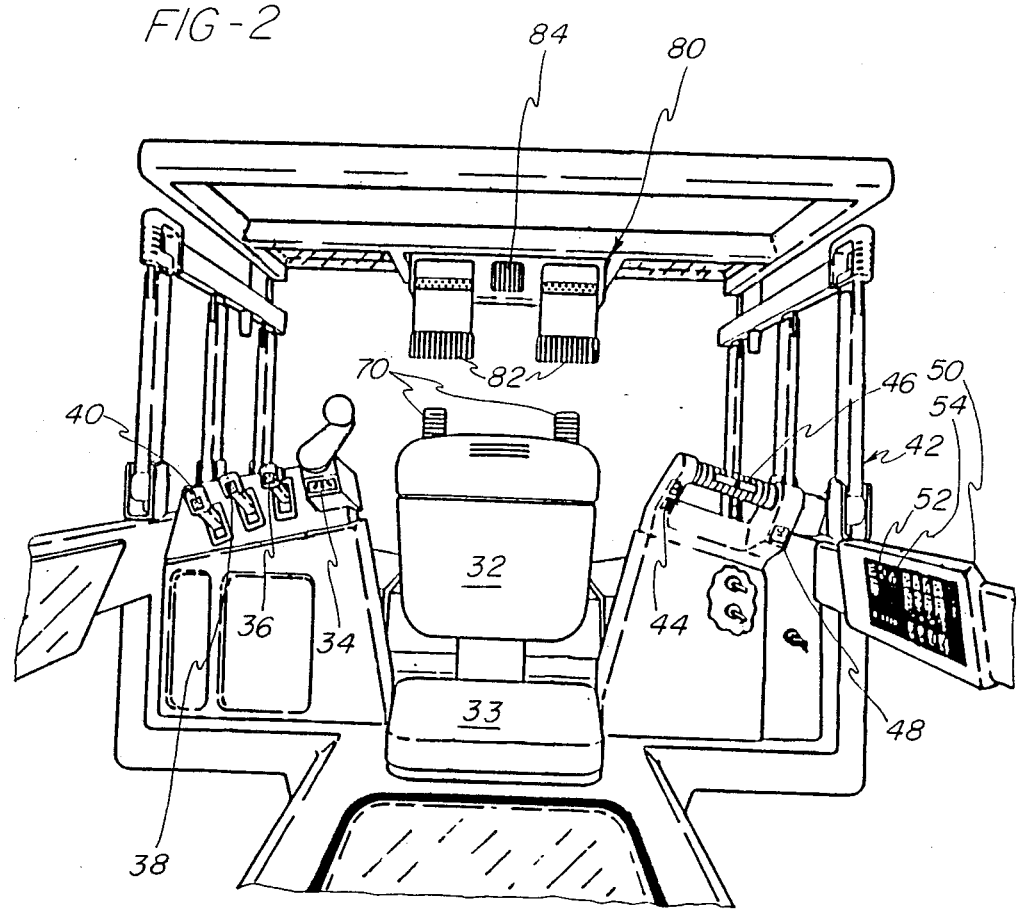
FIG. 2 is a plan view of the operator's platform.

Referring now to the drawings, and particularly to FIG. 1 which illustrates a materials handling vehicle, such as a turret stockpicker, the vehicle includes a power unit 10, a load handling assembly 20, and a platform assembly 30.

The power unit 10 includes a power source, such as a battery unit 12, a pair of load wheels 14 positioned under the platform assembly, a pair of steered wheels 15 positioned under the rear end of the power unit 10 with each wheel being driven by a traction motor, a mast 17 on which the platform assembly 20 rides, and a power unit electronic control unit 18 (FIG. 7). Both the load wheels 14 and the steered wheels 15 include spring applied brakes which are hydraulically released.

The load handling assembly 20 includes a pair of lift forks 22 which may be raised and lowered, traversed and rotated relative to the platform assembly.

The platform assembly 30 includes a seat 32, and back rest 33, from which the operator can operate various controls. On the left, the controls include a steering tiller 34, a fork raise and lower control 36, a fork traverse, retract and extend control 38, and a pivot control 40. On the right, the operator is provided with a traction motor control 42, which includes a horn switch 44, an accelerator twist grip and palm switch 46, and a power disconnect switch 48. An indicator control panel 50 to the right of the operator includes various indicator lamps, a guidance control switch 52, a parking brake switch 54 and various accessory control switches. If standing, the operator controls braking by releasing the foot pedals 70 located on the platform floor. If seated, the operator uses the pedals located on the pedestal 80: dead man pedals 82 must be pressed for the operator to move the vehicle and perform certain control functions; braking is controlled by the service brake pedal 84.

There are several control functions that measure the amount of rotation of the control handles, such as the traction twist grip 46, the steering tiller 43, and the raise/lower control 36. Each of these control handles is provided with an encoder for indicating rotation of its associated shaft.

Figure 3:
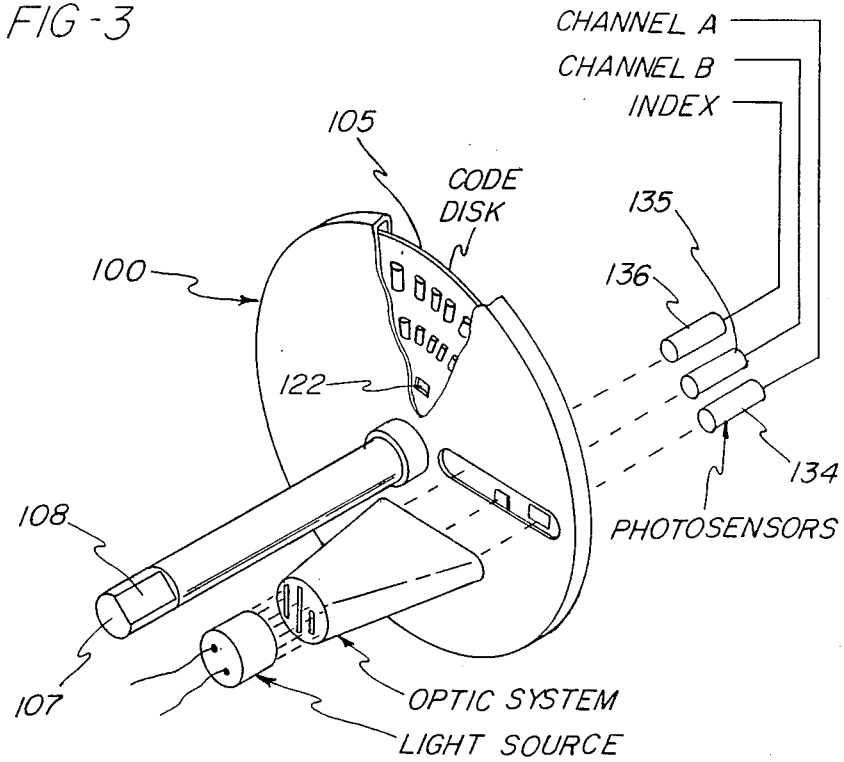
FIG. 3 perspective view of an optical encoder assembly including an optical disk, a light source and photosensors.
Figure 4:
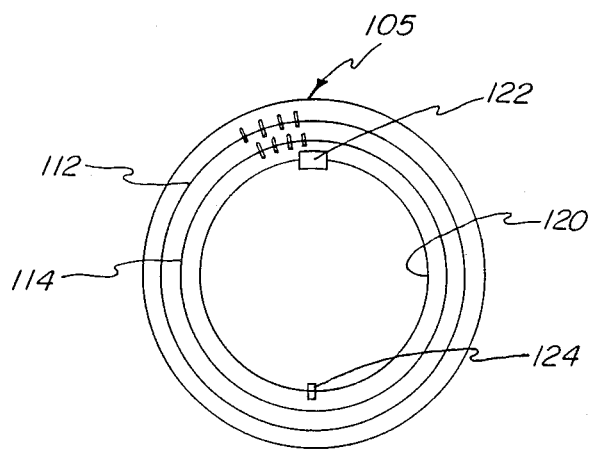
FIG. 4 is a simplified view of the encoder disc showing two different index marks.
Figure 5:
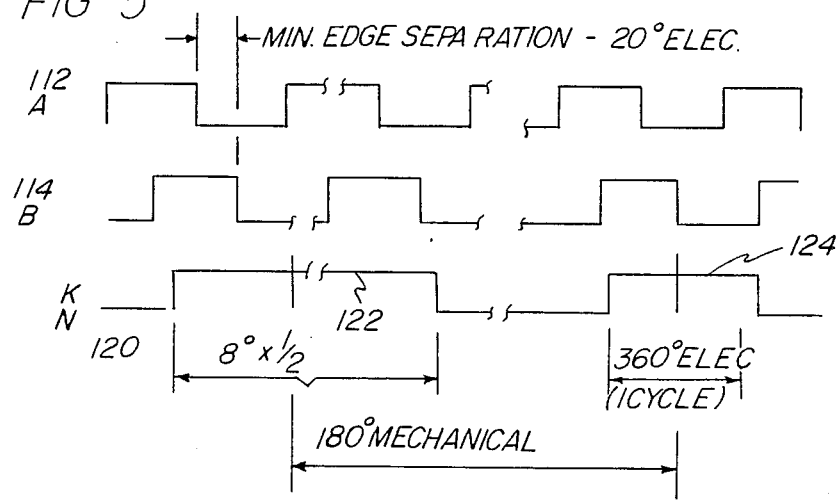
FIG. 5 is a waveform diagram showing the output waveforms from the photodetectors in the encoder assembly of FIG. 3.

A typical encoder 100 is shown in FIG. 3 and includes an encoder disc 105 mounted for rotation on a shaft 107 and contained in a protective housing 110. The disc 105 is provided with rotation indicating track means, which as shown in FIG. 4, includes first and second tracks 112 and 114 provided with offset, equally spaced markings 116 for indicating both amount and direction of rotation of the encoder disc. In the preferred embodiment, the position indicating markings provide 256 pulses per revolution of said encoder disc. The disc 105 is also provided with an index track 120 containing at least one index marking 122. The index marking 122 is substantially wider than several individual rotation indicating markings, and is preferably 8 degrees wide. The index track may also include a second, conventional index mark 124 which is typically one cycle in width, or approximately 1.4 degrees wide. One cycle, in the present case, is from the leading edge of one position indicating marking to the leading edges of the next position indicating mark in the same track, as shown in FIG. 5. This second index mark is spaced 180 degrees from the wide index 122.

Means are provided for correlating said wide index marking to the position of the shaft. Specifically, the shaft 107 is provided with a flat 108 located on the centerline of said index markings. The flat can therefore be used to determine whether the wide index 122 or the conventional index 124 will be used as the operating index.

Means are also provided for sensing the presence and passage of the markings on the rotation indicating track and the index mark. As shown in FIG. 3, the markings are detected by optical means, including a light source 130, optical system 132 and, as shown, three photodetectors 134, 135 and 136.

Figure 11:
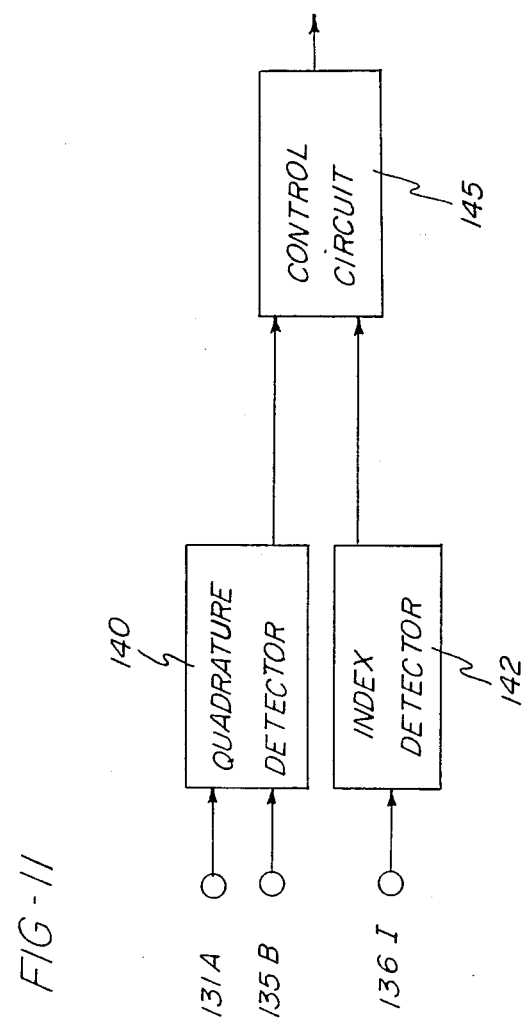
FIG. 11 is a simplified electrical block diagram of the encoder photodetector output circuit.

The output of the photodetectors is illustrated in the waveform diagrams of FIG. 5. The photodetectors 134 and 135 detect the marks as tracks 112 and 114 (A and B tracks), which are shown as being offset from each other by at least 20 electrical degrees, and this output is applied to quadrature detector circuitry 140 (FIG. 11). This is a conventional quadrature system which allows the sensing electronic circuitry to determine not only the amount of rotation, but the direction of rotation as well. Photodetector 136 senses the index track 124 (I). Output circuitry 142 associated with the photodetectors sense are responsive to said wide index marking 122 for indicating when said encoder disc 105 has rotated more than the predetermined amount established by said index marking. The output from both the quadrature circuit 140 and the index detector 142 are applied to a control circuit 145, the output of which provides the control signals appropriate to the particular function.

A single encoder constructed according to the present invention can be use in association with a variety of control devices, and can also be used feedback positional information. For example, the wide index feature of the encoder is particularly useful in connection with the traction control twist grip 46 and the raise/lower control 36. It may also be used with the steering tiller 34, but without using either index. In a third application, the encoder may be used as a steered wheel position indicator using the conventional index mark.

The shaft 107 of encoder ECR-2 is connected to the shaft operated by the raise/lower control handle 36. The flat 108 on the shaft 107 is rotated so that, when the handle 36 is in the neutral position, the wide index 122 is centered in the view of photodetector 136, and then it is secured in place by a set screw. In this particular case, the shaft 107 rotates only about 35 degrees, and therefore the wide index is the only index mark that will be observed by the photodetector 136.

Figure 6:
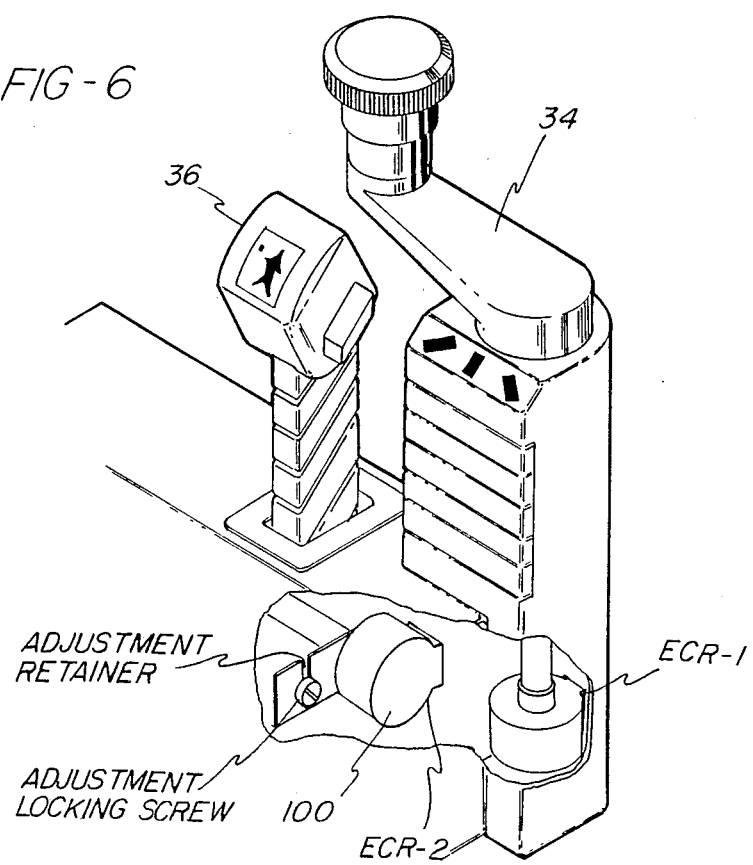
FIG. 6 is a perspective view of the raise/lower control mounted next to a steering tiller on the operator's platform.

The traction twist grip 46 is connected to an encoder ECR-3 in the same manner as the raise/lower control shown in FIG. 6.

The steering tiller 34, on the other hand, uses the encoder but does not require either index since multiple turns of the handle are made to provide high resolution turning control of the vehicle.

When the encoder is used with the wide index 122, the operator must rotate the encoder shaft by the width of the index before control action will begin. This allows the operator to grasp the handle or twist grip without fear of some unwanted action being initiated by some inadvertent movement, and then to begin the control action after the control has been moved a definite amount.

Figure 9:
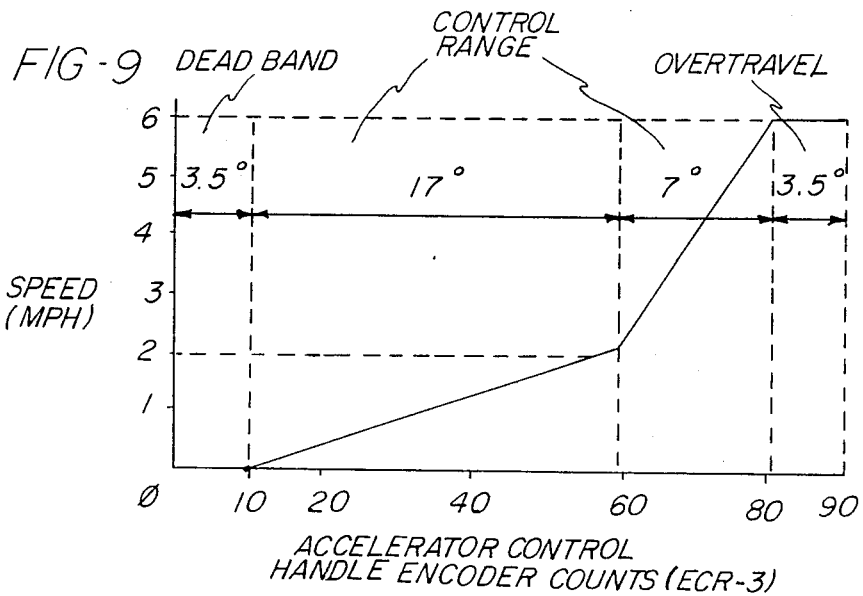
FIG. 9 is a chart showing the relationship between the traction encoder shaft position and vehicle speed.

Of course, electronic circuitry may be provided to enhance the effect by creating an additional dead band beyond that provided by the wide index, as shown in the diagram of FIG. 8 and the chart of FIG. 9. In FIG. 8, the action of the traction twist grip is illustrated where from either side of the spring loaded neutral position, there is first a 4 degree dead band provided by the wide index, and then a 3.5 degree dead band provided by the electronic circuitry. For the next 24 degrees of rotation in either direction, the vehicle speed will increase from 0 to 6 mph. Finally, the electronic circuitry provides an overtravel band of approximately 3.5 degree. Thus, the encoder will experience a maximum of 70 degrees of travel, 35 in either direction, and therefore the second index mark will never be viewed by the photodetector 136.

Referring to FIG. 9, no output from the electronic circuit 145 is provided until the traction twist handle 46 has been rotated more than 4 degrees, or half the width of the wide index. After that, a dead band is created by a counter of 3.5 degrees, or from counts 0 to 10 as represented by the passage of the rotation indicating tracks 112 and 114 relative to the photodetectors. For the next 17 degrees of rotation, or from counts 10 to 60, the speed will increase linearly from 0 to 2 mph; for the next 7 degrees, or from counts 60 to 80, the speed will increase at a much steeper rate from 2 to 6 mph; and in the final 3.5 degrees of rotation before the grip engages mechanical stops, or counts 80 to 100, the speed will not change. This same mode of operation applies equally to movement in either direction of the vehicle.

Figure 10:
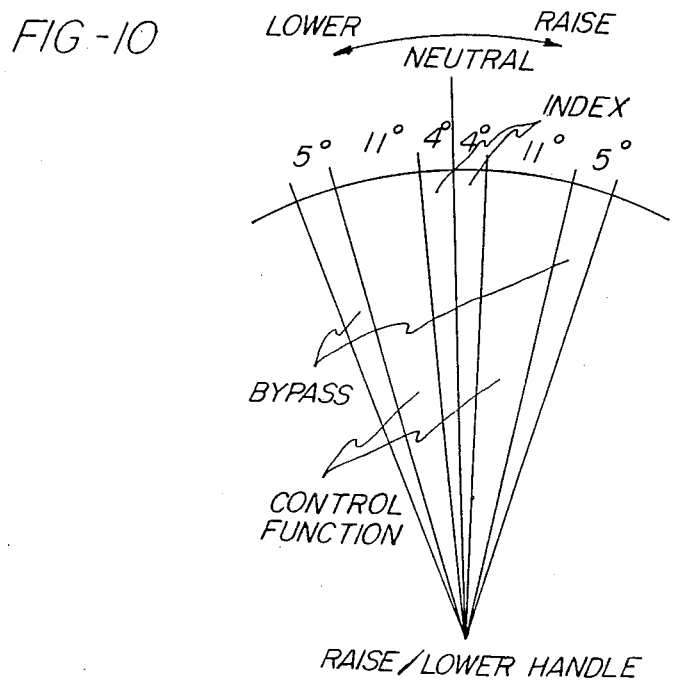
FIG. 10 is a diagram representing the areas of control with respect to the raise/lower control shaft position.

With other controls, however, an electronically created dead band may not be necessary, such as with the raise/lower control 36, in which case, only the dead band provided by the wide index is used. A diagram of the response for the raise/lower control 36 is shown in FIG. 10 where the first 4 degrees in either the raise or lower direction is treated as a dead band by action of the wide index and wherein the next 11 degrees of handle rotation controls the operation of the raise/lower function of the forks. The final 5 degrees of rotation is over travel to ensure the by-pass mode has been achieved, thus to provide protection for the SCR control circuit providing current to the pump motor.

Thus, a wide index band is particularly useful when used with those operator controls where immediate operation of the device being control is not desired when the control handle is initially moved from its neutral position.

While the form of apparatus herein described constitutes a preferred embodiment of this invention, it is to be understood that the invention is not limited to this precise form of apparatus and that changes may be made therein without departing from the scope of the invention, which is defined in the appended claims.

What is claimed is:

1. In an apparatus for converting rotational motion of a shaft into digital signals of the type that includes an encoder disc having rotation indicating track means provided with a plurality of spaced apart markings, an index track with at least one index marking contained thereon, means for sensing the presence of the markings on said rotation indicating track means for indicating the amount of angular rotation of said disc, and means for sensing the presence of the index mark, the improvement comprising the index marking on said index track being formed substantially wider than several individual rotation indicating markings, and means responsive to said wide index marking for indicating when said encoder disc has rotated more than the predetermined amount established by said index marking.

2. The apparatus of claim 1 wherein said rotation indicating track mean includes first and second tracks provided with offset, equally spaced markings for indicating both amount and direction of rotation of the encoder disc.

3. The apparatus of claim 2 wherein said position indicating markings provide 256 pulses per revolution of said encoder disc.

4. The apparatus of claim 1 wherein said shaft is spring biased to return to a neutral position and wherein said wide index provides a tolerance to variations in the actual return position of said shaft.

5. The apparatus of claim 1 wherein said wide index marking is 8 degrees wide.

6. The apparatus of claim 1 wherein said markings are detected by optical means.

7. The apparatus of claim 1 wherein said index track includes a pair of index markings spaced 180 degrees apart, said wide marking being 8 degrees wide, the other being approximately 1.4 degrees wide.

8. The apparatus of claim 6 further including means for correlating said wide index marking to the position of the shaft.

9. The apparatus of claim 7 wherein the shaft includes a flat located on the centerline of said index markings.

* * * * *